(12) United States Patent
Hsieh et al.

(10) Patent No.: US 12,471,408 B2
(45) Date of Patent: Nov. 11, 2025

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Feng-Chien Hsieh, Pingtung County (TW); Yun-Wei Cheng, Taipei (TW); Kuo-Cheng Lee, Tainan (TW); Cheng-Ming Wu, Tainan (TW); Ping Kuan Chang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 424 days.

(21) Appl. No.: 18/152,172

(22) Filed: Jan. 10, 2023

(65) Prior Publication Data

US 2024/0113237 A1    Apr. 4, 2024

Related U.S. Application Data

(60) Provisional application No. 63/378,074, filed on Oct. 2, 2022.

(51) Int. Cl.
  *H10F 77/00*    (2025.01)
  *H01L 25/18*    (2023.01)
  *H10F 71/00*    (2025.01)
  *H10F 77/90*    (2025.01)

(52) U.S. Cl.
  CPC ........... *H10F 77/935* (2025.01); *H01L 25/18* (2013.01); *H10F 71/00* (2025.01); *H10F 77/90* (2025.01); *H10F 77/955* (2025.01)

(58) Field of Classification Search
  CPC .......... H10F 19/10; H10F 19/40; H10F 19/50; H10F 39/103; H10F 39/12; H10F 39/18; H10F 39/199; H10F 39/811; H10F 39/95; H10F 39/809; H10F 30/22; H10F 77/124; H10F 77/211; H10F 77/413; H10F 77/90;
  (Continued)

(56) References Cited

U.S. PATENT DOCUMENTS 11,056,517 B2 *   7/2021   Dayeh ................. H10F 77/1437
2010/0270459 A1 * 10/2010   Augusto .............. H10F 39/156
                                                         250/208.1

(Continued)

*Primary Examiner* — Andres Munoz
(74) *Attorney, Agent, or Firm* — WPAT LAW; Anthony King

(57) ABSTRACT

The present disclosure provides a semiconductor structure and a method of manufacturing the same. The semiconductor structure includes a sensing device, a solar cell, and an interconnecting structure. The solar cell is disposed above the sensing device and is electrically connected to the sensing device. The interconnecting structure is disposed between the sensing device and the solar cell and has a first surface facing the solar cell and a second surface facing the sensing devices. The interconnecting structure comprises a first energy storage component and a second energy storage component. The first energy storage component is disposed closer to the first surface of the interconnecting structure than the second energy storage component.

20 Claims, 10 Drawing Sheets

(58) Field of Classification Search
CPC ............. H10F 77/93–959; H01L 25/16; H01L 25/167; H01L 25/18
See application file for complete search history.

(56) References Cited

U.S. PATENT DOCUMENTS

2011/0101537 A1* 5/2011 Barth ..................... H01L 24/80
257/E21.597
2015/0013746 A1* 1/2015 Shukh .................... H02S 40/38
136/244
2015/0340394 A1* 11/2015 Hirase ................... H10F 39/811
257/292
2018/0103226 A1* 4/2018 Raynor ................ H04N 25/771
2020/0127034 A1* 4/2020 Zhang ................ H10F 39/8063

* cited by examiner

SEMICONDUCTOR STRUCTURE AND METHOD OF MANUFACTURING THE SAME

PRIORITY CLAIM AND CROSS-REFERENCE

This application claims priority over U.S. Provisional Application No. 63/378,074 filed Oct. 2, 2022, the disclosure of which is hereby incorporated by reference in its entirety.

BACKGROUND

Image sensors have been widely used in various applications. When the size of image sensors decreases to fit into miniaturized applications, the power supply becomes an important consideration.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1:
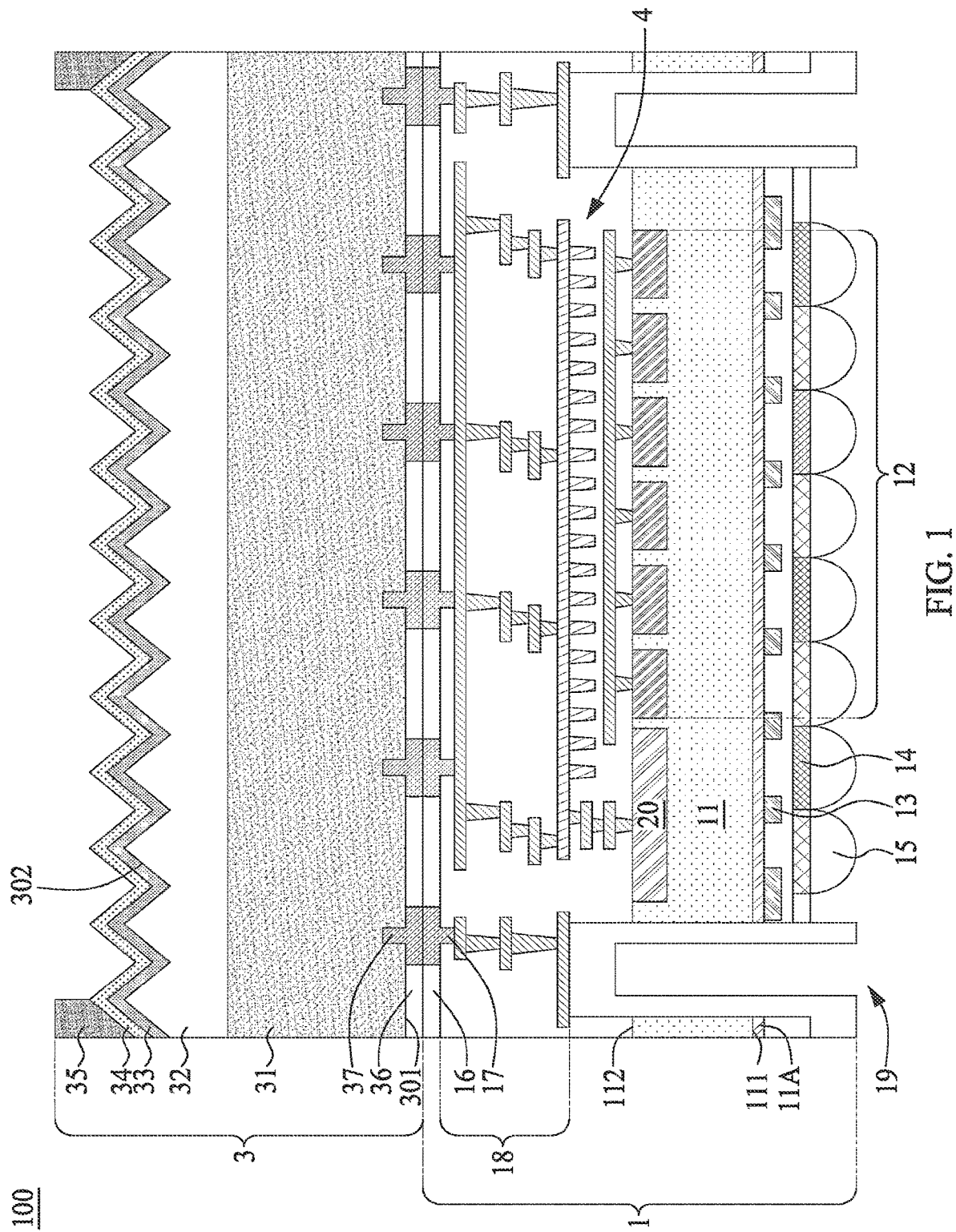
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of a semiconductor structure 100, in accordance with some embodiments. The semiconductor structure 100 includes a sensing device 1 and a solar cell 3. The sensing device 1 may be disposed on the solar cell 3, or vice versa. In some embodiments, the sensing device 1 and the solar cell 3 may be bonded together. The sensing device 1 may be electrically connected to the solar cell 3. The solar cell 3 may be configured to generate power through a photovoltaic effect that generates a voltage or electric current therein when the solar cell 3 is exposed to light (e.g., ultraviolet, visible light, or infrared). The solar cell 3 may be configured to provide power to the sensing device 1, such that the sensing device 1 can be operated. The sensing device 1 may be configured to detect the light from the environment. The sensing device 1 may include, for example but not limited to, a CMOS image sensor, proximity sensor, infrared sensor, or the like.

As shown in FIG. 1, the sensing device 1 includes a substrate 11, a plurality of sensing units 12, a plurality of grids 13, a plurality of filter elements 14, a plurality of microlenses 15, a dielectric layer 16, a plurality of conductive pads 17, a circuit layer 18, a plurality of through vias 19, and an inverter 20.

The substrate 11 may be a semiconductor substrate. The substrate 11 may be a doped silicon substrate. The substrate 11 may have a thickness in a range from about 1 μm to about 8 μm. The substrate 11 has a backside surface 111 and a frontside surface (or an active surface) 112 opposite to the backside surface 111. The substrate 11 may include an antireflection layer 11A disposed on the backside surface 111 of the substrate 11.

The sensing units 12 are disposed in the substrate 11 and adjacent to the frontside surface 112 of the substrate 11. The sensing units 12 may be spaced apart from each other by a distance or a portion of the substrate 11. In some embodiments, the sensing units 12 may be spaced apart from each other by a plurality of deep trench isolation (DTI) structures (not shown). The sensing units 12 may be an array and arranged in a matrix pattern. The sensing units 12 may each include a photodiode, a floating node, a transfer gate transistor, a reset transistor, and/or a row select transistor. The photodiodes of the sensing units 12 may receive light and generate an electric current, which may be transferred through the transfer gate transistor to the floating node. When one or more of the sensing units 12 are selected by a controller of the sensing device 1, the corresponding row select transistors may be turned on, such that the potential at the floating node may be extracted through the row select transistors. The reset transistor of the sensing units 12 may be controlled to reset the floating node or the photodiode.

Each of the sensing units 12 may be aligned with the corresponding filter element 14 and the corresponding microlens 15. The filter elements 14 are configured to filter light from the environment to a specific range of wavelength. In some embodiments, the specific range of wavelength may correspond to the wavelength of visible light, e.g., red, green, or blue light. In some embodiments, the specific range of wavelength may correspond to the wavelength of near infrared (NIR), infrared, ultraviolet, or another wavelength. The microlens 15 may be configured to focus or collimate the light from the environment. The microlens 15 may be aligned with the filter elements 14. The microlens 15 may be disposed on the filter elements 14. The microlens 15 may have a curved shape.

The grids 13 may be misaligned with the sensing units 12. The grids 13 may be configured to prevent cross-talk among the neighboring sensing units 12. The grids 13 may include material with high reflectivity to reflect unwanted light from the corresponding sensing unit.

The dielectric layer 16 is disposed on the circuit layer 18. The circuit layer 18 is disposed on the frontside surface 112 of the substrate 11. The circuit layer 18 may include a plurality of conductive traces or conductive vias for electrically connecting to the sensing units 12, the inverter 20, the through vias 19, and/or the conductive pads 17. The circuit layer 18 may include one or more dielectric layers enclosing the conductive traces or conductive vias.

The conductive pads 17 are disposed in the dielectric layer 16 and have a top surface exposed from the dielectric layer 16. The conductive pads 17 may be in contact with and electrically connected to a plurality of conductive traces in a topmost dielectric layer of the circuit layer 18.

The through vias 19 extend through the substrate 11 and have a portion in the circuit layer 18. The through vias 19 are electrically connected to the solar cell 3 through the circuit layer 18. The through vias 19 may be electrically connected to an external device (not shown).

The solar cell 3 has a first surface 301 facing the sensing device 1 or the frontside surface 112 of the substrate 11. The solar cell 3 has a second surface 302 opposite to the first surface 301 of the solar cell 3. The solar cell 3 is configured to receive light through the second surface 302. The solar cell 3 includes a first doped region 31, a second doped region 32, a transparent conductive film 33, an antireflection coating 34, a plurality of electrical contacts 35, a dielectric layer 36, and a plurality of conductive pads 37.

The first doped region 31 and the second doped region 32 may have opposite doped types. For example, the first doped region 31 may be a p-type doped region and the second doped region 32 may be an n-type doped region. The first doped region 31 and the second doped region 32 may form a junction, in which the photovoltaic effect occurs. The thickness of the first doped region 31 may be in a range from about 50 µm to about 600 µm. The thickness of the second doped region 32 may be less than 1 µm.

The transparent conductive film 33 is disposed on the second doped region 32. The antireflection coating 34 is disposed on the transparent conductive film 33. The second doped region 32 may have a plurality of triangular shapes on the second surface 302 in a cross-sectional view. The second doped region 32 may have random pyramidal shapes from a top view (not shown). Since the transparent conductive film 33 is disposed on the second surface 302, the transparent conductive film 33 may have a topography conforming to the triangular shapes and/or random pyramidal shapes. Since the antireflection coating 34 is disposed on the transparent conductive film 33, the antireflection coating 34 may have a topography conforming to the triangular shapes and/or random pyramidal shapes.

The electrical contacts 35 are disposed on the second surface 302 of the solar cell 3 and electrically connected to the first and second regions 301 and 302. The electrical contacts 35 may be configured to conduct the power generated by the solar cells. The electrical contacts 35 may include conductive material, such as, copper, gold, silver, aluminum or the like. The electrical contacts 35 may include a finger structure.

The dielectric layer 36 is disposed on the first surface 301 of the solar cell 3. The conductive pads 37 are disposed in the dielectric layer 36. The conductive pads 37 may be electrically connected to the first and second doped regions 31 and 32.

The conductive pads 17 of the sensing device 1 are bonded to the conductive pads 37 of the solar cell 3, or vice versa. The conductive pads 17 of the sensing device 1 may be aligned with the conductive pads 37 of the solar cell 3, such that the bondability between the sensing device 1 and the solar cell 3 can be improved. The dielectric layer 16 of the sensing device 1 are bonded to the dielectric layer 36 of the solar cell 3 through van der Waals force, or vice versa.

The semiconductor structure 100 further includes a plurality of energy storage components 4. The energy storage components 4 are disposed in the dielectric layer of the circuit layer 18. The energy storage components 4 are electrically connected to the solar cell 3. The energy storage components 4 are configured to store the energy generated from the solar cell 3. The energy storage components 4 may include metal-insulator-metal (MIM) capacitors. The energy storage components 4 may be disposed in the same dielectric layer of the circuit layer 18. In some embodiments, the energy storage components 4 may be substantially at the same elevation relative to the frontside surface 112 of the sensing device 1. The energy storage components 4 may occupy a region and the routing of the conductive traces and conductive vias will be adjusted accordingly. The energy storage components 4 may provide energy/power sufficient for the sensing device 1 to operate. The direct current (DC) voltage of the energy storage components 4 may be converted to alternating current (AC) power before be transmitted to the sensing units 12 (e.g., the row select transistors). The semiconductor device 100 is able to independently provide power to the sensing device, using the solar cell 3 and the energy storage component 4. Therefore, the integration of the sensing device 1 and the solar cell 3 allows the size of the semiconductor device 100 to be smaller than other sensing devices which need external power devices and additional connection circuitry.

Figure 2:
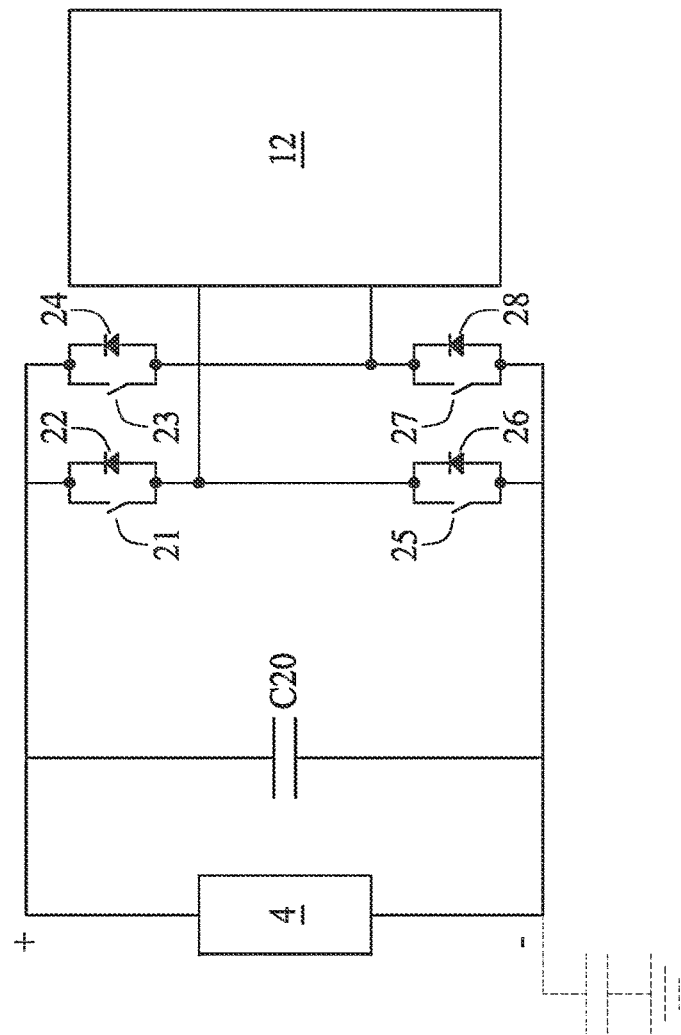
FIG. 2 is a schematic diagram of an inverter of a semiconductor structure, in accordance with some embodiments.

FIG. 2 is a schematic diagram of the inverter 20 of the semiconductor structure 100, in accordance with some embodiments. The inverter 20 is electrically connected between the energy storage components 4 and the sensing units 12. The inverter 20 includes a capacitor C20, a plurality of switches 21, 23, 25, and 27, and a plurality of diodes 22, 24, 26, and 28. The switches 21, 23, 25, and 27 are respectively coupled with the diodes 22, 24, 26, and 28. The diodes 22, 24, 26, and 28 are configured to protect the switches 21, 23, 25, and 27. The capacitor C20 is electrically connected to the energy storage components 4 in parallel and configured to stabilize the voltage of the energy storage components 4.

The switches 21, 23, 25 and 27 are controlled to be turned on or off. In the first condition, wherein the switches 21 and 27 are turned on, while the switches 23 and 25 are turned off, the energy storage components 4 are electrically connected to the sensing units 12 through the switches 21 and 27. In the second condition, wherein the switches 23 and 25 are turned on, while the switches 21 and 27 are turned off, the energy storage components 4 are electrically connected to the sensing units 12 through the switches 23 and 25. The first condition and the second condition provide the sensing units 12 with voltages having opposite polarities or electric currents having opposite directions.

Figure 3A:
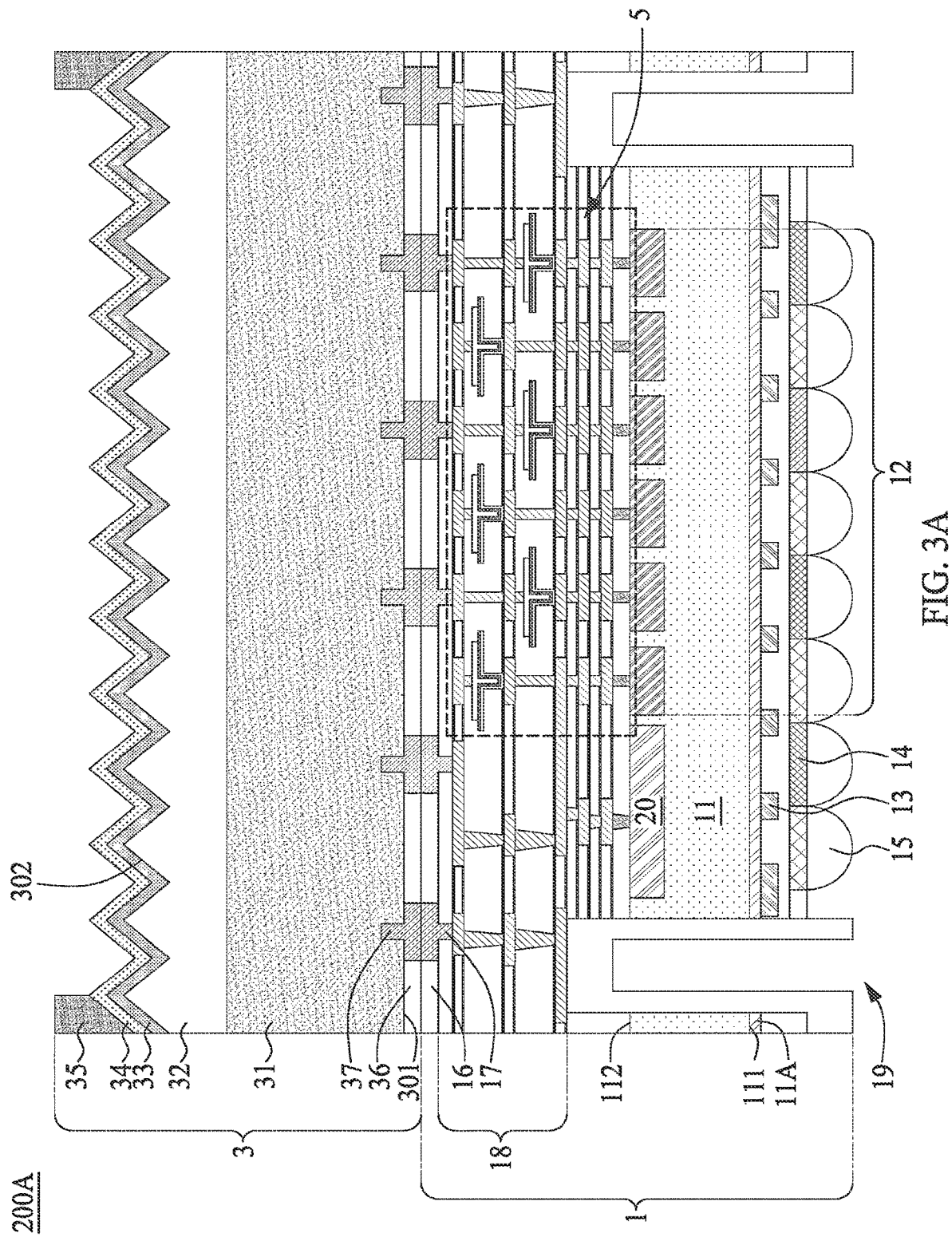
FIG. 3A is a cross-sectional view of a semiconductor structure, in accordance with some embodiments.

FIG. 3A is a cross-sectional view of a semiconductor structure 200A, in accordance with some embodiments. The semiconductor structure 200A includes components, devices, or units having the same reference numerals as those of the semiconductor structure 100. The detailed descriptions thereof are mentioned in the previous paragraphs.

The semiconductor structure 200A further includes an interconnecting structure 5. The interconnecting structure 5 is disposed in the circuit layer 18. The interconnecting structure 5 may be disposed above the sensing units 12, the inverter 20, or the substrate 11. The interconnecting structure 5 may be electrically connected to the solar cell 3, the sensing units 12, and/or the inverter 20 through the conductive traces and/or the conductive vias of the circuit layer 18. The solar cell 3 is configured to provide power to the sensing device 1 through the interconnecting structure 5. The interconnecting structure 5 may be electrically connected to the conductive pads 17 of the sensing device 1. A portion or the entire interconnecting structure 5 and a portion or the entire circuit layer 18 may be formed during the same process.

Figure 3B:
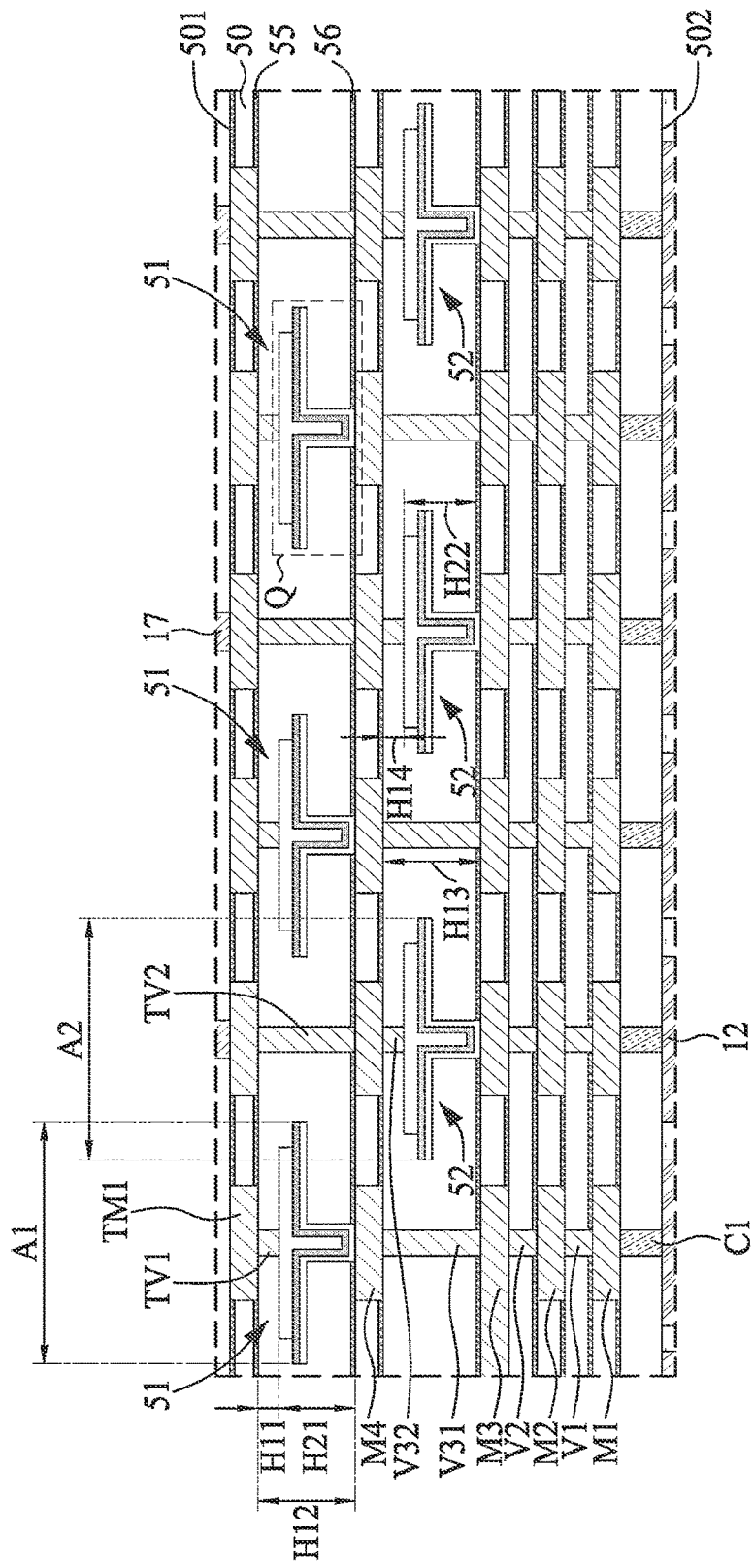
FIG. 3B is an enlarged view of an interconnecting structure of a semiconductor structure, in accordance with some embodiments.

FIG. 3B is an enlarged view of the interconnecting structure 5 of the semiconductor structure 200A, in accordance with some embodiments. The interconnecting structure 5 has a first surface 501 facing the solar cell 3 and a second surface 502 facing the sensing device 1. The interconnecting structure 5 includes a dielectric layer 50, a plurality of seal layers 55, and a plurality of seal layers 56. The dielectric layer 50 may include a plurality of portions. The interconnecting structure 5 may include a plurality of contacts C1, a plurality of conductive traces (or traces) M1, M2, M3, M4, and TM1, and a plurality of conductive vias (or vias) V1, V2, V31, V32, TV1, and TV2. The material of the contacts C1 may include tungsten, copper, gold, tantalum, titanium, aluminum, or the like. The material of the conductive traces M1, M2, M3, M4, and TM1 may include tungsten, copper, gold, tantalum, titanium, aluminum, or the like. The material of the conductive vias V1, V2, V31, V32, TV1, and TV2 may include tungsten, copper, gold, tantalum, titanium, aluminum, or the like. In some embodiments, the conductive vias V1, V2, V31, V32, TV1, and TV2 may have a taper shape.

The contacts C1 may be in contact with and electrically connected to the sensing units 12. The contacts C1 are disposed adjacent to the second surface 502 of the interconnecting structure 5. The contacts C1 are disposed in a portion of the dielectric layer 50. The conductive traces M1 are disposed on the contacts C1. The contacts C1 are electrically connected to the conductive traces M1. The conductive vias V1 are disposed on the conductive traces M1. The conductive traces M1 are electrically connected to the conductive vias V1. The conductive traces M1 and the conductive vias V1 are disposed in a portion of the dielectric layer 50. The conductive traces M1 may be disposed between two seal layers 56 and have a surface exposed from one of the seal layers 56 for connecting to the contact C1 and another surface exposed from the other seal layer 56 for connecting to the conductive vias V1.

The conductive traces M2 are disposed on the conductive vias V1. The conductive vias V1 are electrically connected to the conductive traces M2. The conductive vias V2 are disposed on the conductive traces M2. The conductive traces M2 are electrically connected to the conductive vias V2. The conductive traces M2 and the conductive vias V2 are disposed in a portion of the dielectric layer 50. The conductive traces M2 may be disposed between two seal layers 56 and have a surface exposed from one of the seal layers 56 for connecting to the conductive vias V1 and another surface exposed from the other seal layer 56 for connecting to the conductive vias V2.

The conductive traces M3 are disposed on the conductive vias V2. The conductive vias V2 are electrically connected to the conductive traces M3. The conductive vias V31 are disposed on the conductive traces M3. The conductive traces M3 are electrically connected to the conductive vias V31. The conductive traces M3 and the conductive vias V3 are disposed in a portion of the dielectric layer 50. The conductive traces M3 may be disposed between two seal layers 56 and have a surface exposed from one of the seal layers 56 for connecting to the conductive vias V2 and another surface exposed from the other seal layer 56 for connecting to the conductive vias V3.

As shown in FIG. 3B, the interconnecting structure 5 further includes one or more energy storage components 51 and one or more energy storage components 52. The energy storage components 51 and 52 are electrically connected to the inverter 20 through the conductive traces (e.g., the conductive traces M3) and conductive vias of the interconnecting structure 5. The sensing units 12 (or the photodiodes) may be disposed below the energy storage components 51 and 52.

The energy storage components 52 are disposed on the conductive traces M3. The conductive vias V32 are disposed on the energy storage components 52. In other words, the energy storage components 52 are disposed between the conductive traces M3 and the conductive vias V32. The energy storage components 52 may be in contact with and electrically connected to the conductive traces M3 or the conductive vias V32. The conductive vias V31 connected to the conductive traces M3 have a height H13 and the conductive vias V32 connected to the energy storage components 52 have a height H14. The height H13 of the conductive vias V31 is different from the height H14 of the conductive vias V32. The height H13 may be greater than the height H14. The energy storage components 52 have a height H22. The height H13 of the conductive vias V31 equals a sum of the height H14 of the conductive vias V32 and the height H22 of the energy storage components 52. The height H22 of the energy storage components 52 may be smaller than the height H13 of the conductive vias V31.

The energy storage components 52 are interleaved with the conductive vias V31. As shown in FIG. 3B, one of the energy storage components 52 may be surrounded by two conductive vias V31; or one of conductive vias V31 may be surrounded by two energy storage components 52.

The conductive traces M4 are disposed on the conductive vias V31. The conductive vias V31 are electrically connected to the conductive traces M4. The conductive vias TV2 are disposed on the conductive traces M4. The conductive traces M4 are electrically connected to the conductive vias TV2. The conductive traces TM1 are disposed on the conductive vias TV2. The conductive traces TM1 are electrically connected to the conductive vias TV2. The conductive traces TM1 may be electrically connected to the conductive pads 17. Some of the conductive trace TM1 may not be connected to the conductive pads 17. In some embodiments, all of the conductive traces TM1 may be connected to the conductive pads 17. The conductive traces TM1 and the conductive vias TV2 are disposed in a portion of the dielectric layer 50. The conductive traces M4 may be disposed between two seal layers 56 and have a surface exposed from one of the seal layers 56 for connecting to the conductive vias V31 or V32 and another surface exposed from the other seal layer 56 for connecting to the conductive vias TV1. The conductive traces TM1 may be disposed between two seal layers 55 and have a surface exposed from one of the seal layers 55 for connecting to the conductive vias TV1 or TV2 and another surface exposed from the other seal layer 56 for connecting to the conductive pads 17 of the sensing device 1.

The energy storage components 51 are disposed on the conductive traces M4. The conductive vias TV1 are disposed on the energy storage components 51. In other words, the energy storage components 51 are disposed between the conductive traces M4 and the conductive vias TV1. The energy storage components 51 may be in contact with and electrically connected to the conductive traces M4 or the conductive vias TV1. The conductive vias TV1 connected to the energy storage components 51 have a height H11 and the conductive vias V32 connected to the conductive traces M3 have a height H12. The height H11 of the conductive vias TV1 is different from the height H12 of the conductive vias TV2. The height H12 may be greater than the height H11. The energy storage components 51 have a height H21. The height H12 of the conductive vias TV2 equals a sum of the height H11 of the conductive vias TV1 and the height H21 of the energy storage components 51. The height H12 of the energy storage components 51 may be smaller than the height H12 of the conductive vias TV2.

The energy storage components 51 are interleaved with the conductive vias TV2. As shown in FIG. 3B, one of the energy storage components 51 may be surrounded by two conductive vias TV2; or one of conductive vias TV2 may be surrounded by two energy storage components 51.

In some embodiments, the energy storage component 51 is disposed closer to the surface 501 of the interconnecting structure 5 than the energy storage component 52. The energy storage component 51 has a first projecting area A1 on the surface 501 of the interconnecting structure 5 and the energy storage component 52 has a second projecting area A2 on the surface 501 of the interconnecting structure 5. The first projecting area A1 partially overlaps the second projecting area A2.

The energy storage components 51 may be connected in parallel to store the energy/power generated from the solar cell 3. The energy storage components 52 may be connected in parallel to store the energy/power generated from the solar cell 3. The energy storage components 51 and the energy storage components 52 are disposed in a dislocated manner to prevent a serial connection therebetween. Alternatively, one energy storage component 51 may be connected to one energy storage component 52 in serial to adjust the total capacitance. The energy storage components 51 and the energy storage components 52 are disposed in different portions of the dielectric layer 50, e.g., a portion surrounding the conductive vias TV2 and a portion surrounding the conductive vias V31. Therefore, the number of energy storage components 51 and 52 of the semiconductor structure 200A is more than the number of energy storage components which only disposed at the same portion of the dielectric layer. The energy storage components 51 and 52 of the semiconductor structure 200A may be able to store more energy/power than the energy storage components 4 of the semiconductor structure 100. The inverter 20 is configured to convert a direct current (DC) voltage of the energy storage components 51 and 52 to an AC voltage for the sensing device 1. Hence, the energy storage components 51 and 52 may facilitate the integration of the sensing device 1 with a solar cell which has a relatively low conversion efficiency.

Furthermore, the interconnecting structure 5 may be configured to transmit electrical signals to the sensing units 12. The interconnecting structure 5 may have conductive traces or vias that are used for transmitting electrical signals to the sensing units 12.

The energy storage component 51 and the energy storage component 52 each includes a metal-insulator-metal (MIM) capacitor. The energy storage component 51 and the energy storage component 52 may include a 3D MIM capacitor. Detailed descriptions of the 3D MIM capacitor can be found in FIG. 3C.

Figure 3C:
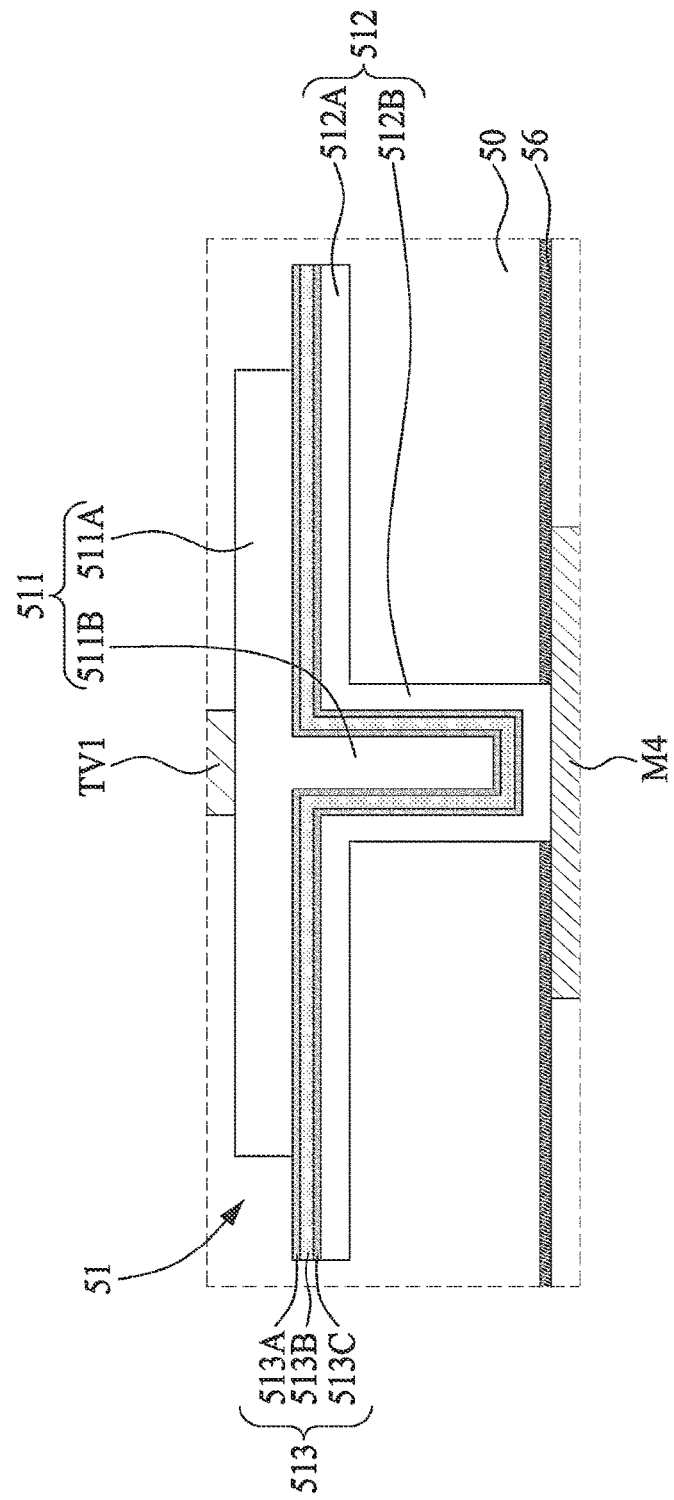
FIG. 3C is an enlarged view of a block Q in FIG. 3B, in accordance with some embodiments.

FIG. 3C is an enlarged view of a block Q in FIG. 3B, in accordance with some embodiments. As shown in FIG. 3C, the MIM capacitor of the energy storage component 51 includes a first metallization layer 511, a second metallization layer 512, and a dielectric layer 513 disposed between the first and second metallization layers 511 and 512. The MIM capacitor of the energy storage component 51 is surrounded by the dielectric layer 50 of the interconnecting structure 5. The first metallization layer 511 is connected to the conductive via TV1. The first metallization layer 511 includes a first portion 511A substantially parallel to the seal layer 56 and a second portion 511B substantially perpendicular to the seal layer 56. The second portion 511B may be connected to a middle of the first portion 511A. The second metallization layer 512 is connected to the conductive trace M4. The second metallization layer 512 includes a first portion 512A substantially parallel to the seal layer 56 and a second portion 512B substantially perpendicular to the seal layer 56. The second portion 512B may be connected to a middle of the first portion 512A. In some embodiments, the second portion 512B may have a taper shape. The second portion 512B of the second metallization layer 512 may define a hole for accommodating the second portion 511B of the first metallization layer 511 and a portion of the dielectric layer 513.

The dielectric layer 513 may have a topography conforming to the second metallization layer 512. In other words, the dielectric layer 513 may have a portion substantially parallel to the seal layer 56 and another portion substantially perpendicular to the seal layer 56. The dielectric layer 513 may have a sandwich structure. The dielectric layer 513 includes a first layer 513A, a second layer 513B, and a third layer 513C. The second layer 513B may be disposed between the first layer 513A and the third layer 513C. The thickness of the second layer 513B may be greater than that of the first layer 513A or the third layer 513C.

The dielectric layer 513 has a dielectric constant higher than that of the dielectric layer 50. The dielectric layer 513 may include high-k material. The first layer 513A has a dielectric constant higher than that of the second layer 513B. The third layer 513C has a dielectric constant higher than that of the second layer 513B. The first layer 513A and the third layer 513C may have the same dielectric constant.

Alternatively, the first layer 513A and the third layer 513C may have different dielectric constants.

Referring back to FIG. 3B, the energy storage component 52 may have a similar structure as described in FIG. 3C. As shown in FIG. 3B, a portion of the second metallization layer of the energy storage component 51 parallel to the seal layer 55 may partially overlap with a portion of the second metallization layer of the energy storage component 52 parallel to the seal layer 55, e.g., a portion of the first projecting area A1 that overlaps a portion of the first projecting area A2. In some embodiments, a portion of the second metallization layer of the energy storage component 51 perpendicular to the seal layer 55 may not overlap a portion of the second metallization layer of the energy storage component 52 perpendicular to the seal layer 55, e.g., a portion of the first projecting area A1 that does not overlap a portion of the first projecting area A2. The conductive vias TV2 are disposed over the conductive vias V32 and the conductive vias TV1 are disposed over the conductive vias V31. The conductive vias TV2 may substantially align with the conductive vias V32 and the conductive vias TV1 may substantially align with the conductive vias V31.

In some embodiments, the dielectric layer 50 of the interconnecting structure 5 may have low-k dielectric material, such as, silicon dioxide (k around 3.9-4.1), fluorine silicate glass (FSG) (k around 3.5-3.7), hard black diamond (HBD) (k around 2.9-3.1), black diamond (BD) (k around 2.0-2.7), or extreme low dielectric constant, ELK, material (k around 2.55).

In some embodiments, the dielectric layer 513 of the interconnecting structure 5 may have high-k dielectric material with κ in a range from about 7 to 2000, such as, Si3N4, Al2O3, Ta2O5, TiO2, SrTiO3, ZrO2, HfO2, HfSiO4, La2O3, Y2O3 or the like.

The high-k dielectric material of the dielectric layer 513 increases the capacitance of the MIM capacitor of the energy storage component 51, such that the energy storage component 51 may store more energy/power.

In some embodiments, the seal layer 55 and the seal layer 56 may be made of different materials. The material of the seal layer 55 may include SiN. The material of the seal layer 56 may include SiC.

Figure 4A:
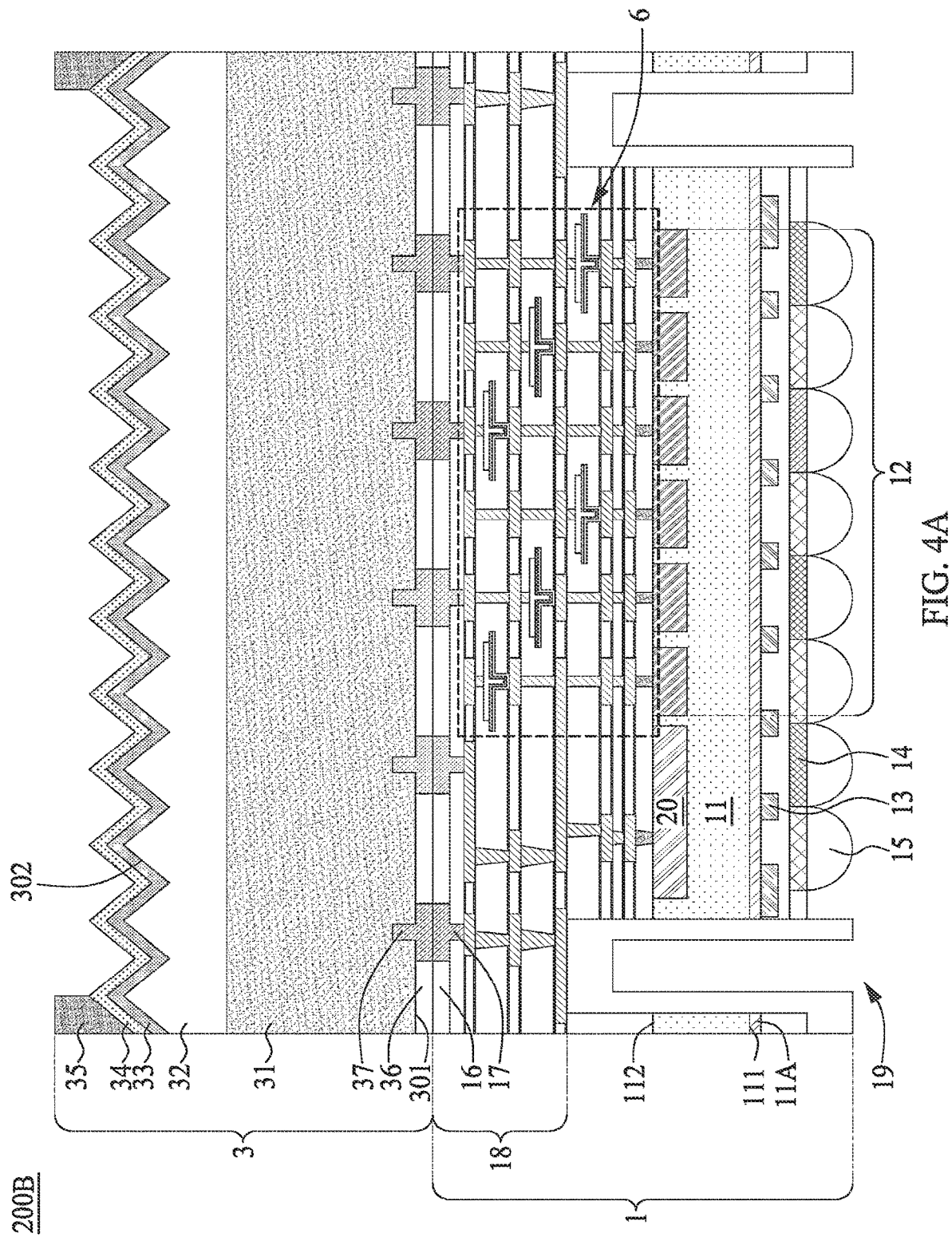
FIG. 4A is a cross-sectional view of a semiconductor structure, in accordance with some embodiments.

FIG. 4A is a cross-sectional view of a semiconductor structure 200B, in accordance with some embodiments. The semiconductor structure 200B includes components, devices, or units having the same reference numerals as those of the semiconductor structure 100. The detailed descriptions thereof are mentioned in the previous paragraphs.

The semiconductor structure 200B further includes an interconnecting structure 6. The interconnecting structure 6 is disposed in the circuit layer 18. The interconnecting structure 6 may be disposed above the sensing units 12, the inverter 20, or the substrate 11. The interconnecting structure 6 may be electrically connected to the solar cell 3, the sensing units 12, and/or the inverter 20 through the conductive traces and/or the conductive vias of the circuit layer 18. The interconnecting structure 6 may be electrically connected to the conductive pads 17 of the sensing device 1. A portion or the entire interconnecting structure 6 and a portion or the entire circuit layer 18 may be formed in the same process.

Figure 4B:
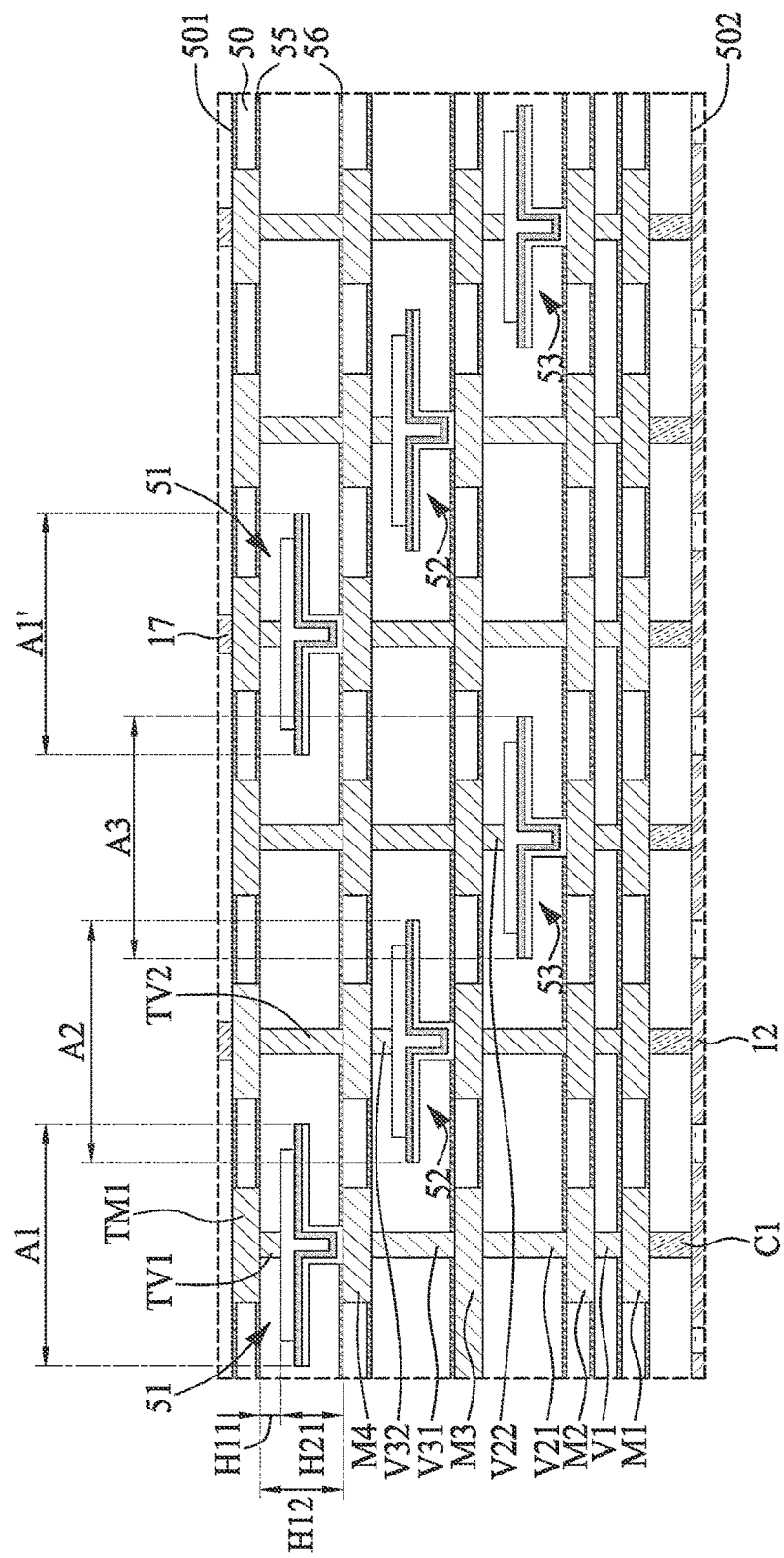
FIG. 4B is an enlarged view of an interconnecting structure of a semiconductor structure, in accordance with some embodiments.

FIG. 4B is an enlarged view of the interconnecting structure 6 of the semiconductor structure 200B, in accordance with some embodiments. The interconnecting structure 6 of the semiconductor structure 200B includes components, devices, or units having the same reference numerals as those of the interconnecting structure 5 of the semiconductor structure 200A. The detailed descriptions thereof are mentioned in the previous paragraphs.

As shown in FIG. 4B, the interconnecting structure 6 further includes a plurality of energy storage components 53. The energy storage components 53 are disposed below the energy storage components 52. The energy storage components 53 may be farther from the surface 501 of the interconnecting structure 6 than the energy storage components 51 and the energy storage components 52.

The energy storage component 53 has a third projecting area A3 on the surface 501 of the interconnecting structure 6. The second projecting area A2 may partially overlap with the third projecting area A3. The energy storage component 51 on the right side of FIG. 4B may have a first projecting area A1'. The first projecting area A1' may partially overlap with the third projecting area A3.

The energy storage component 53 may have a 3D MIM capacitor similar to that described in accordance with FIG. 3C. As shown in FIG. 4B, a portion of the second metallization layer of the energy storage component 52 parallel to the seal layer 55 may partially overlap with a portion of the second metallization layer of the energy storage component 53 parallel to the seal layer 55, e.g., a portion of the second projecting area A2 that overlaps with a portion of the third projecting area A3. In some embodiments, a portion of the second metallization layer of the energy storage component 52 perpendicular to the seal layer 55 may partially overlap with a portion of the second metallization layer of the energy storage component 53 perpendicular to the seal layer 55, e.g., a portion of the second projecting area A2 that does not overlap a portion of the third projecting area A3.

The energy storage components 53 are interleaved with the conductive vias V21. As shown in FIG. 4B, one of the energy storage component 53 may be surrounded by two conductive vias V21; or one of the conductive vias V21 may be surrounded by two energy storage components 53. The energy storage components 53 may surround a plurality of conductive vias V21, e.g., two conductive vias V21 or more. The energy storage components 52 may surround a plurality of conductive vias V31, e.g., two conductive vias V31 or more. The energy storage components 51 may surround a plurality of conductive vias TV2, e.g., two conductive vias TV2 or more.

The embodiment as illustrated in FIGS. 4A and 4B, of three sets of energy storage components 51, 52, and 53 disposed in different portions of the dielectric layer 50 does not limit the numbers of energy storages components. For example, the interconnecting structure 6 may include four or more sets of energy storage components in different portions of the dielectric layer 50.

Figure 5A:
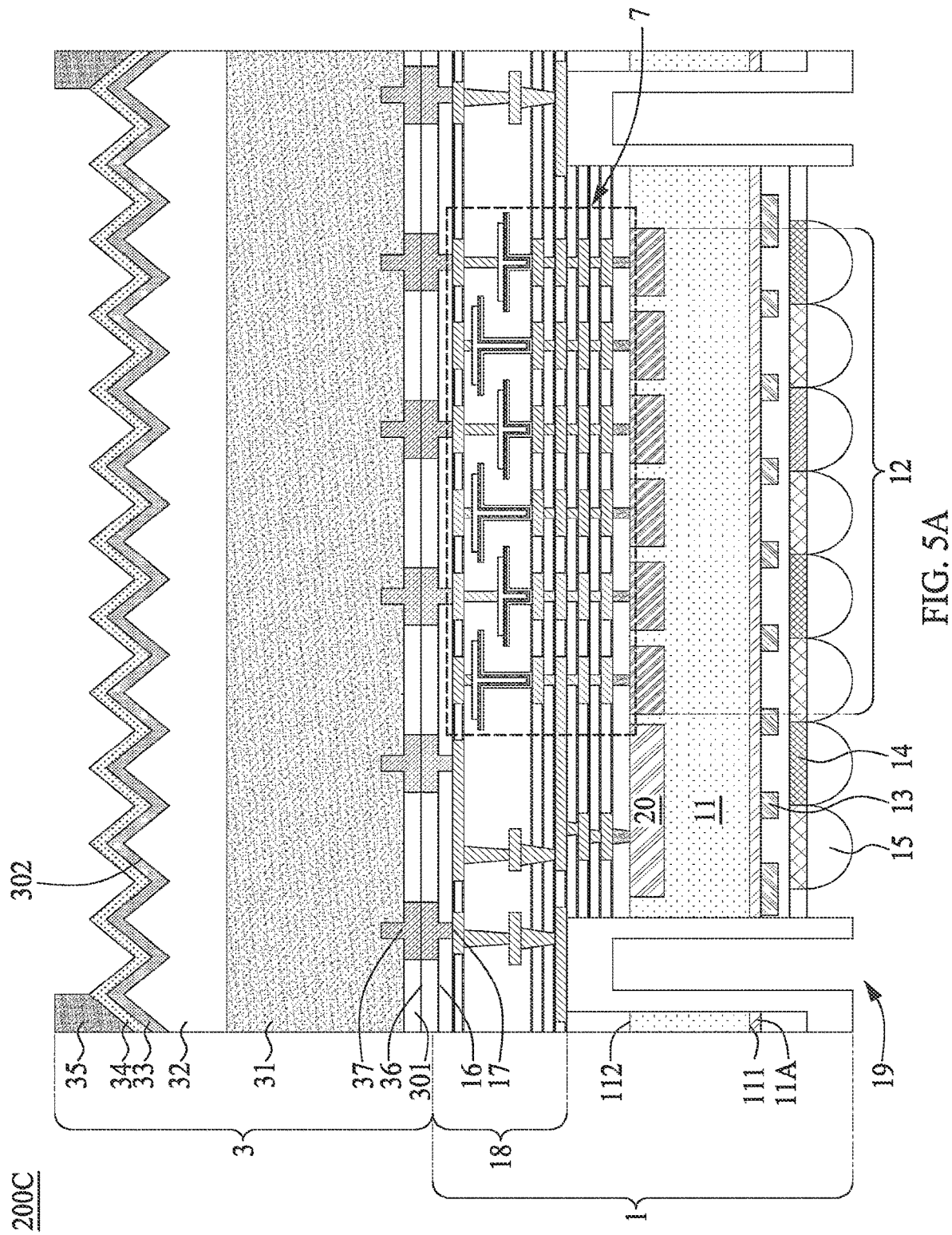
FIG. 5A is a cross-sectional view of a semiconductor structure, in accordance with some embodiments.

FIG. 5A is a cross-sectional view of a semiconductor structure 200C, in accordance with some embodiments. The semiconductor structure 200C includes components, devices, or units having the same reference numerals as those of the semiconductor structure 100. The detailed descriptions thereof are mentioned in the previous paragraphs.

The semiconductor structure 200C further includes an interconnecting structure 7. The interconnecting structure 7 is disposed in the circuit layer 18. The interconnecting structure 7 may be disposed above the sensing units 12, the inverter 20, or the substrate 11. The interconnecting structure 6 may be electrically connected to the solar cell 3, the sensing units 12, and/or the inverter 20 through the conductive traces and/or the conductive vias of the circuit layer 18.

The interconnecting structure 6 may be electrically connected to the conductive pads 17 of the sensing device 1. A portion or the entire interconnecting structure 7 and a portion or the entire circuit layer 18 may be formed in the same process.

Figure 5B:
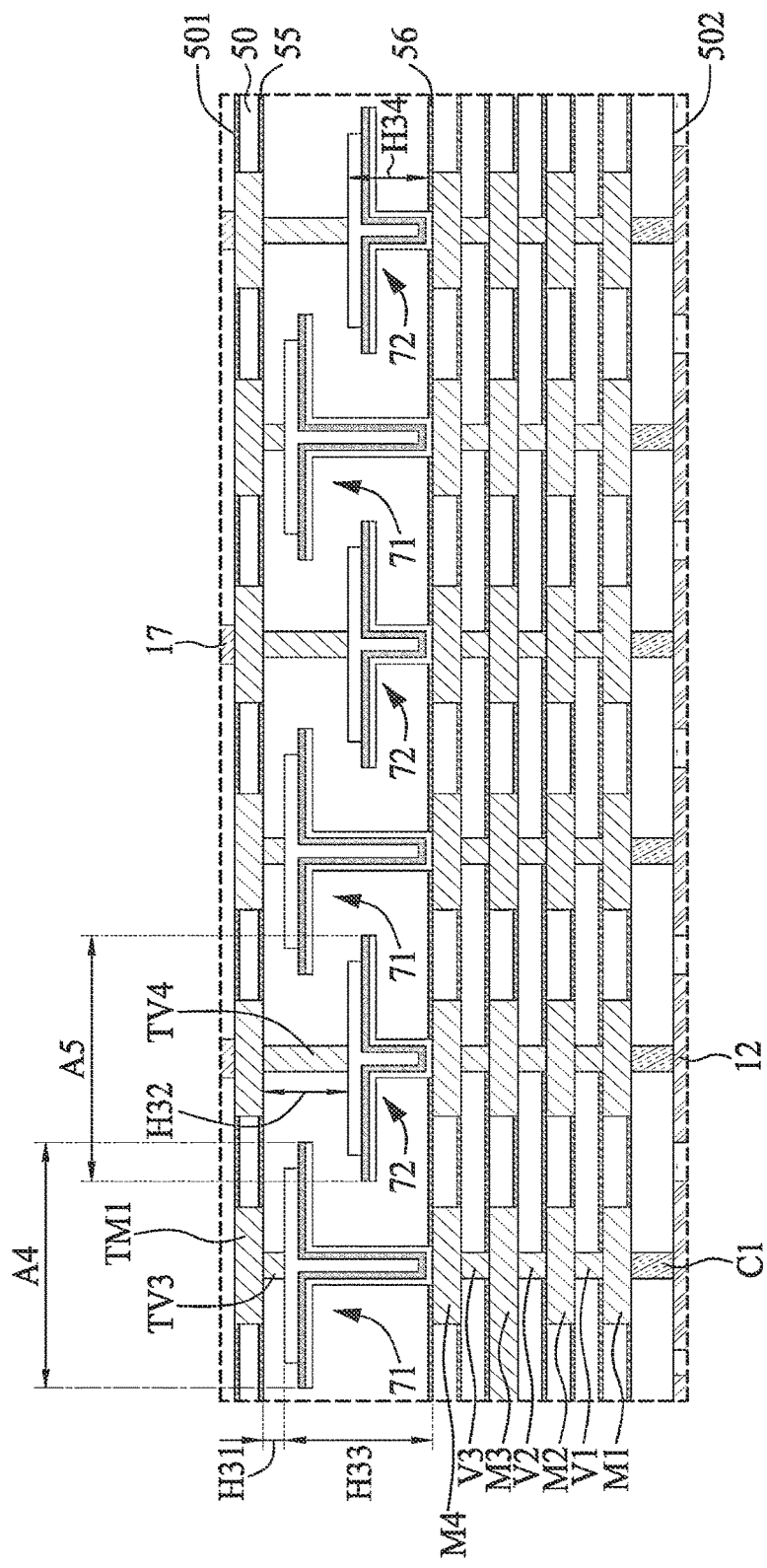
FIG. 5B is an enlarged view of an interconnecting structure of a semiconductor structure, in accordance with some embodiments.

FIG. 5B is an enlarged view of the interconnecting structure 7 of the semiconductor structure 200C, in accordance with some embodiments. The interconnecting structure 7 semiconductor structure 200C includes components, devices, or units having the same reference numerals as those of the interconnecting structure 5 of the semiconductor structure 200A. The detailed descriptions thereof are mentioned in the previous paragraphs.

The interconnecting structure 7 may include one or more energy storage components 71 and include one or more energy storage components 72. The energy storage components 71 may be configured to store energy/power from the solar cell 3. The energy storage components 71 may be configured to store energy/power from the solar cell 3. The energy storage components 71 and 72 are electrically connected to the inverter 20 through the conductive traces (e.g., the conductive traces M3) and conductive vias of the interconnecting structure 7. The interconnecting structure 7 includes a plurality of conductive vias TV3 disposed on the energy storage components 71 and a plurality of conductive vias TV4 disposed on the energy storage components 72. The conductive vias TV3 and TV4 are disposed in a portion of the dielectric layer 50. The conductive vias TV3 may electrically connect the conductive traces TM1 and the energy storage components 71. The conductive vias TV4 may electrically connect the conductive traces TM1 and the energy storage components 72.

The conductive vias TV3 have a height H31. The conductive vias TV4 have a height H32. The height H31 and the height H32 are different. The height H31 is less than the height H32. The energy storage components 71 have a height H33. The energy storage components 72 have a height H34. The height H33 and the height H33 are different. The height H33 is greater than the height H34. The sum of the height H31 and the height H33 substantially equals the sum of the height H32 and the height H34.

The energy storage components 71 and 72 may be disposed in the same portion of the dielectric layer 50 of the interconnecting structure 7, e.g., a portion surrounding the conductive vias TV3 and TV4. The energy storage components 71 and 72 may be connected in parallel to store the energy/power generated from the solar cell 3. In some embodiments, the energy storage component 71 is disposed closer to the surface 501 of the interconnecting structure 7 than the energy storage component 72. The energy storage component 71 has a fourth projecting area A4 on the surface 501 of the interconnecting structure 7 and the energy storage component 72 has a fifth projecting area A5 on the surface 501 of the interconnecting structure 7. The fourth projecting area A4 partially overlaps the fifth projecting area A5. The energy storage components 71 and 72 may have a 3D MIM capacitor, as described in accordance with FIG. 3C. As shown in FIG. 5B, a portion of the second metallization layer of the energy storage component 71 parallel to the seal layer 55 may partially overlap with a portion of the second metallization layer of the energy storage component 72 parallel to the seal layer 55, e.g., a portion of the second projecting area A4 that overlaps with a portion of the third projecting area A5.

In a comparative embodiments, energy storage components having the same height and structure in the same portion of the dielectric layer may increase the area to fulfill the design rule of the back-end of line process. In the present disclosure, the energy storage components 71 are interleaved with the energy storage components 72. Since the energy storage components 71 and 72 have different heights, the portion of the energy storage components 71 and 72 extending in a direction parallel to the surface 501 of the interconnecting structure 71 may be arranged in a dislocated manner. Therefore, the energy storage components 71 and 72 of the semiconductor structure 200C has a more dense arrangement than the energy storage components having the same height and structure in the same portion of the dielectric layer.

Figure 6:
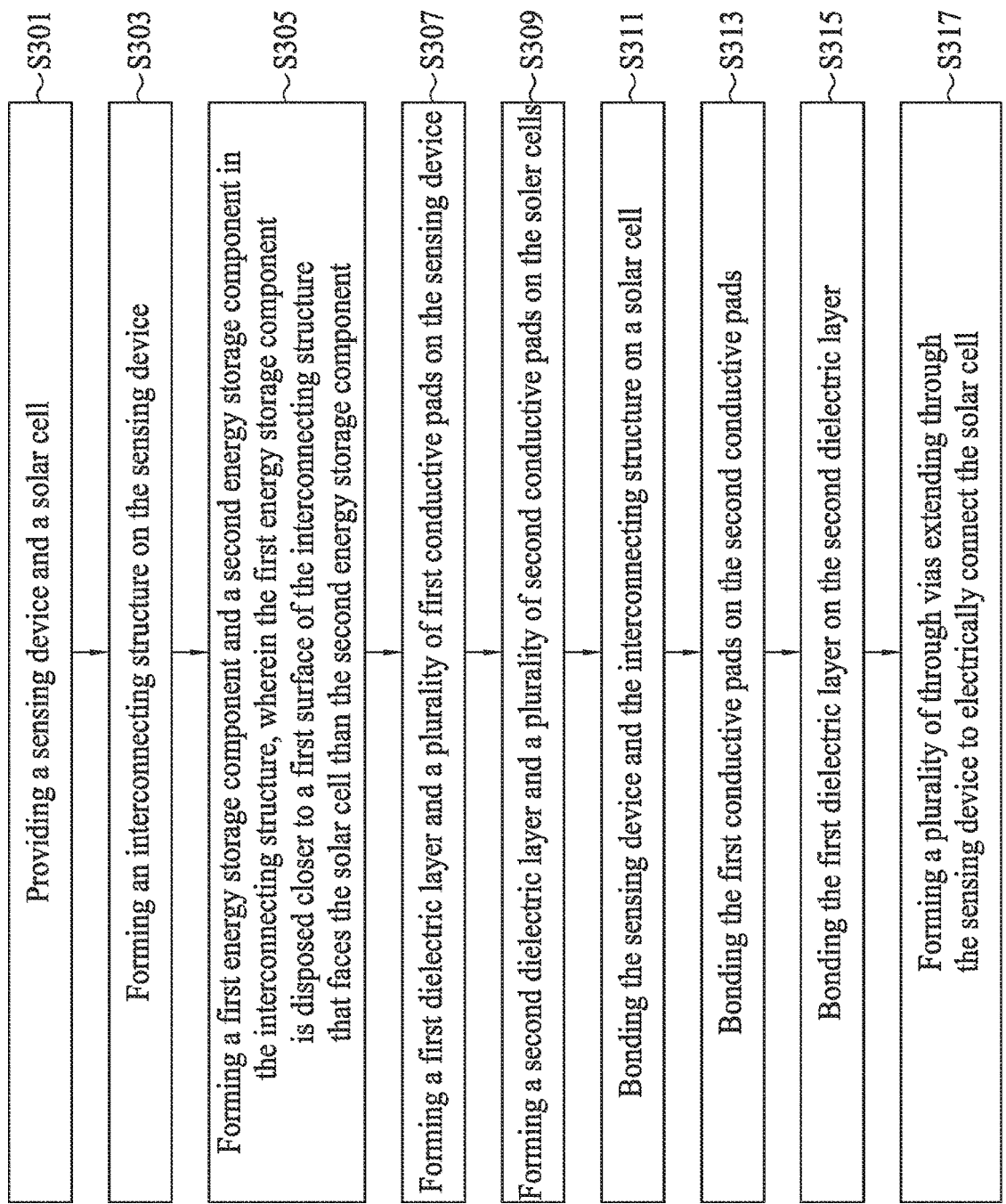
FIG. 6 is a flowchart showing a method of manufacturing a semiconductor structure, in accordance with some embodiments.

FIG. 6 is a flowchart showing a method 300 of manufacturing a semiconductor structure (e.g., the semiconductor structures 200A, 200B, 200C), in accordance with some embodiments.

In operation S301, the method 300 begins with providing a sensing device and a solar cell. The sensing device may be configured to detect light in the environment. The solar cell may be configured to generate energy/power.

In operation S303, the method 300 continues with forming an interconnecting structure on the sensing device. The interconnecting structure may include a plurality of conductive traces and vias.

In operation S305, the method 300 continues with forming a first energy storage component (e.g., the energy storage component 51, 52, 53, 71, or 72) and a second energy storage component (e.g., the energy storage component 51, 52, 53, 71, or 72) in the interconnecting structure. The first energy storage component is disposed closer to a first surface of the interconnecting structure which faces the solar cell than the second energy storage component.

In operation S307, the method 300 continues forming a first dielectric layer and a plurality of first conductive pads on the sensing device.

In operation S309, the method 300 continues forming a second dielectric layer and a plurality of second conductive pads on the solar cells.

In operation S311, the method 300 continues bonding the sensing device and the interconnecting structure on the solar cell. The bonding may include oxide-oxide bonding or hybrid bonding.

In operation S313, the method 300 continues bonding the first conductive pads on the second conductive pads.

In operation S315, the method 300 continues bonding the first dielectric layer on the second dielectric layer.

In operation S317, the method 300 continues forming a plurality of through vias extending through the sensing device to electrically connect the solar cell.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 6. In some embodiments, the method 300 can include one or more operations depicted in FIG. 6.

According to other embodiments, a semiconductor structure is provided. The semiconductor structure includes a sensing device, a solar cell, and an interconnecting structure. The solar cell is disposed above the sensing device and electrically connected to the sensing device. The interconnecting structure is disposed between the sensing device and the solar cell and has a first surface facing the solar cell and a second surface facing the sensing devices. The interconnecting structure comprises a first energy storage component and a second energy storage component. The first energy storage component is disposed closer to the first surface of the interconnecting structure than the second energy storage component.

According to other embodiments, a semiconductor structure is provided. The semiconductor structure includes a sensing device, a solar cell, and an interconnecting structure. The solar cell is disposed above the sensing device. The interconnecting structure is disposed between the sensing device and the solar cell disposed between the sensing device and the solar cell. The interconnecting structure comprises a plurality of first vias and a plurality of first energy storage components interleaved with the first vias.

According to other embodiments, a method of manufacturing a semiconductor structure, comprising: providing a sensing device and a solar cell; forming an interconnecting structure on the sensing device; forming a first energy storage component and a second energy storage component in the interconnecting structure, wherein the first energy storage component is disposed closer to a first surface of the interconnecting structure which faces the solar cell than the second energy storage component; forming a first dielectric layer and a plurality of first conductive pads on the sensing device; forming a second dielectric layer and a plurality of second conductive pads on the solar cells; and bonding the sensing device and the interconnecting structure on the solar cell.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A semiconductor structure, comprising:
   a sensing device;
   a solar cell disposed above the sensing device and electrically connected to the sensing device;
   an interconnecting structure disposed between the sensing device and the solar cell and having a first surface facing the solar cell and a second surface facing the sensing device,
   wherein the interconnecting structure comprises a first energy storage component and a second energy storage component, and
   wherein the first energy storage component is disposed closer to the first surface of the interconnecting structure than the second energy storage component.

2. The semiconductor structure of claim 1, wherein the interconnecting structure includes a first via connected to the first energy storage component and a second via connected to the second energy storage component, wherein a first height of the first via is smaller than a second height of the second via.

3. The semiconductor structure of claim 2, wherein the second height substantially equals a sum of the first height and a third height of the first energy storage component.

4. The semiconductor structure of claim 2, wherein the interconnecting structure comprises a plurality of third vias and a plurality of third energy storage components interleaved with the plurality of third vias.

5. The semiconductor structure of claim 1, wherein the first energy storage component and the second energy storage component each includes a metal-insulator-metal (MIM) capacitor.

6. The semiconductor structure of claim 1, wherein the first energy storage component has a first projecting area on the first surface of the interconnecting structure and the second energy storage component has a second projecting area on the first surface of the interconnecting structure, wherein the first projecting area partially overlaps the second projecting area.

7. The semiconductor structure of claim 1, wherein the interconnecting structure further includes a third energy storage component farther from the first surface of the interconnecting structure than the first energy storage component and the second energy storage component.

8. The semiconductor structure of claim 7, wherein the first energy storage component has a first projecting area on the first surface of the interconnecting structure, the second energy storage component has a second projecting area on the first surface of the interconnecting structure, and the third energy storage component has a third projecting area on the first surface of the interconnecting structure, wherein the first projecting area partially overlaps the second projecting area and the third projecting area partially overlaps the second projecting area.

9. The semiconductor structure of claim 1, further comprising:
   a first dielectric layer disposed on the sensing device and a plurality of first conductive pads disposed in the first dielectric layer;
   a second dielectric layer disposed on the sensing device and a plurality of second conductive pads disposed in the second dielectric layer,
   wherein each of the first conductive pads is aligned with a corresponding one of the second conductive pads.

10. The semiconductor structure of claim 1, wherein the sensing device includes a plurality of photodiodes disposed below the interconnecting structure.

11. The semiconductor structure of claim 1, further comprising:
    a plurality of through vias extending through the sensing device and electrically connected to the solar cell.

12. The semiconductor structure of claim 1, wherein the solar cell is configured to provide power to the sensing device through the interconnecting structure.

13. The semiconductor structure of claim 1, wherein the second energy storage component surrounds a plurality of conductive vias.

14. A semiconductor structure, comprising:
    a sensing device;
    a solar cell disposed above the sensing device;
    an interconnecting structure disposed between the sensing device and the solar cell, wherein the interconnecting structure comprises a plurality of first vias and a plurality of first energy storage components interleaved with the first vias.

15. The semiconductor structure of claim 14, wherein the interconnecting structure comprises a plurality of second vias and a plurality of second energy storage components interleaved with the second vias.

16. The semiconductor structure of claim 15, wherein the plurality of first vias are disposed above and electrically connected to the plurality of second energy storage components, and the plurality of second vias are disposed below and electrically connected to the first plurality of energy storage components.

17. The semiconductor structure of claim 15, wherein the interconnecting structure comprises a plurality of third vias and a plurality of third energy storage components interleaved with the third vias.

18. A semiconductor structure, comprising:
a sensing device and a solar cell;
an interconnecting structure formed on the sensing device;
a first energy storage component and a second energy storage component formed in the interconnecting structure, wherein the first energy storage component is disposed closer to a first surface of the interconnecting structure which faces the solar cell than the second energy storage component;
a first dielectric layer and a plurality of first conductive pads formed on the sensing device;
a second dielectric layer and a plurality of second conductive pads formed on the solar cells, wherein
the sensing device and the interconnecting structure are bonded on the solar cell.

19. The semiconductor structure of claim 18, wherein the first conductive pads are bonded on the second conductive pads; and wherein the first dielectric layer are bonded on the second dielectric layer.

20. The semiconductor structure of claim 18, further comprising:
a plurality of through vias extending through the sensing device to electrically connect the solar cell.

* * * * *